(12) United States Patent
Flemming et al.

(10) Patent No.: US 11,076,489 B2
(45) Date of Patent: Jul. 27, 2021

(54) RF INTEGRATED POWER CONDITION CAPACITOR

(71) Applicant: 3D GLASS SOLUTIONS, INC., Albuquerque, NM (US)

(72) Inventors: Jeb H. Flemming, Albuquerque, NM (US); Jeff A. Bullington, Albuquerque, NM (US)

(73) Assignee: 3D Glass Solutions, Inc., Albuquerque, NM (US)

( * ) Notice: Subject to any disclaimer, the term of this patent is extended or adjusted under 35 U.S.C. 154(b) by 0 days.

(21) Appl. No.: 16/482,889

(22) PCT Filed: Mar. 28, 2019

(86) PCT No.: PCT/US2019/024496
§ 371 (c)(1),
(2) Date: Aug. 1, 2019

(87) PCT Pub. No.: WO2019/199470
PCT Pub. Date: Oct. 17, 2019

(65) Prior Publication Data
US 2020/0383209 A1   Dec. 3, 2020

Related U.S. Application Data

(60) Provisional application No. 62/655,618, filed on Apr. 10, 2018.

(51) Int. Cl.
*H05K 3/00*   (2006.01)
*C03C 3/095*  (2006.01)
(Continued)

(52) U.S. Cl.
CPC .......... *H05K 3/0023* (2013.01); *C03C 3/095* (2013.01); *H01G 4/129* (2013.01); *H01G 4/35* (2013.01);
(Continued)

(58) Field of Classification Search
CPC ............... H05K 3/0023; H05K 3/0094; H05K 2201/017; H01G 9/0029; H01G 4/35; H01G 4/129; C03C 3/095
See application file for complete search history.

(56) References Cited

U.S. PATENT DOCUMENTS 2,515,940 A   7/1950   Stookey
2,515,941 A   7/1950   Stookey
(Continued)

FOREIGN PATENT DOCUMENTS

CN   1562831    4/2004
CN   105938928   9/2016
(Continued)

OTHER PUBLICATIONS

Grine, F. et al., "High-Q Substrate Integrated Waveguide Resonator Filter With Dielectric Loading," IEEE Access vol. 5, Jul. 12, 2017, pp. 12526-12532.
(Continued)

*Primary Examiner* — Syed I Gheyas
(74) *Attorney, Agent, or Firm* — Edwin S. Flores; Chalker Flores, LLP (57) ABSTRACT

The present invention includes a method of fabricating an integrated RF power condition capacitor with a capacitance greater than or equal to 1 of and less than 1 mm$^2$, and a device made by the method.

24 Claims, 2 Drawing Sheets

(51) Int. Cl.
*H01G 4/12* (2006.01)
*H01G 4/35* (2006.01)
*H01G 9/00* (2006.01)

(52) U.S. Cl.
CPC ......... *H01G 9/0029* (2013.01); *H05K 3/0094* (2013.01); *H05K 2201/017* (2013.01)

(56) References Cited

U.S. PATENT DOCUMENTS

| | | |
|---|---|---|
| 2,628,160 A | 2/1953 | Stookey |
| 2,684,911 A | 7/1954 | Stookey |
| 2,971,853 A | 2/1961 | Stookey |
| 3,904,991 A | 9/1975 | Ishli et al. |
| 3,985,531 A | 10/1976 | Grossman |
| 3,993,401 A | 11/1976 | Strehlow |
| 4,029,605 A | 6/1977 | Kosiorek |
| 4,131,516 A | 12/1978 | Bakos et al. |
| 4,413,061 A | 11/1983 | Kumar |
| 4,514,053 A | 4/1985 | Borelli et al. |
| 4,537,612 A | 8/1985 | Borelli et al. |
| 4,647,940 A | 3/1987 | Traut et al. |
| 4,692,015 A | 9/1987 | Loce et al. |
| 4,788,165 A | 11/1988 | Fong et al. |
| 4,942,076 A | 7/1990 | Panicker et al. |
| 5,078,771 A | 1/1992 | Wu |
| 5,147,740 A | 9/1992 | Robinson |
| 5,212,120 A | 5/1993 | Araujo et al. |
| 5,371,466 A | 12/1994 | Arakawa et al. |
| 5,374,291 A | 12/1994 | Yabe et al. |
| 5,395,498 A | 3/1995 | Gombinsky et al. |
| 5,409,741 A | 4/1995 | Laude |
| 5,733,370 A | 3/1998 | Chen et al. |
| 5,779,521 A | 7/1998 | Muroyama et al. |
| 5,850,623 A | 12/1998 | Carman, Jr. et al. |
| 5,902,715 A | 5/1999 | Tsukamoto et al. |
| 5,919,607 A | 7/1999 | Lawandy et al. |
| 5,998,224 A | 12/1999 | Rohr et al. |
| 6,066,448 A | 5/2000 | Wohlstadter et al. |
| 6,094,336 A | 7/2000 | Weekamp |
| 6,136,210 A | 10/2000 | Biegelsen et al. |
| 6,171,886 B1 | 1/2001 | Ghosh |
| 6,258,497 B1 | 7/2001 | Kropp et al. |
| 6,287,965 B1 | 9/2001 | Kang et al. |
| 6,329,702 B1 | 12/2001 | Gresham et al. |
| 6,373,369 B2 | 4/2002 | Huang et al. |
| 6,383,566 B1 | 5/2002 | Zagdoun |
| 6,485,690 B1 | 11/2002 | Pfost et al. |
| 6,511,793 B1 | 1/2003 | Cho et al. |
| 6,514,375 B2 | 2/2003 | Kijima |
| 6,562,523 B1 | 5/2003 | Wu et al. |
| 6,678,453 B2 | 1/2004 | Bellman et al. |
| 6,686,824 B1 | 2/2004 | Yamamoto et al. |
| 6,783,920 B2 | 8/2004 | Livingston et al. |
| 6,824,974 B2 | 11/2004 | Pisharody et al. |
| 6,843,902 B1 | 1/2005 | Penner et al. |
| 6,875,544 B1 | 4/2005 | Sweatt et al. |
| 6,932,933 B2 | 8/2005 | Halvajian et al. |
| 6,977,722 B2 | 12/2005 | Wohlstadter et al. |
| 7,033,821 B2 | 4/2006 | Kim et al. |
| 7,132,054 B1 | 11/2006 | Kravitz et al. |
| 7,179,638 B2 | 2/2007 | Anderson |
| 7,277,151 B2 | 10/2007 | Ryu et al. |
| 7,306,689 B2 | 12/2007 | Okubora et al. |
| 7,326,538 B2 | 2/2008 | Pitner et al. |
| 7,407,768 B2 | 8/2008 | Yamazaki et al. |
| 7,410,763 B2 | 8/2008 | Su et al. |
| 7,439,128 B2 | 10/2008 | Divakaruni |
| 7,470,518 B2 | 12/2008 | Chiu et al. |
| 7,497,554 B2 | 3/2009 | Okuno |
| 7,603,772 B2 | 10/2009 | Farnsworth et al. |
| 7,948,342 B2 | 5/2011 | Long |
| 8,062,753 B2 | 11/2011 | Schreder et al. |
| 8,076,162 B2 | 12/2011 | Flemming et al. |
| 8,096,147 B2 | 1/2012 | Flemming et al. |
| 8,361,333 B2 | 1/2013 | Flemming et al. |
| 8,492,315 B2 | 7/2013 | Flemming et al. |
| 8,709,702 B2 | 4/2014 | Flemming et al. |
| 9,385,083 B1 | 7/2016 | Herrault et al. |
| 9,449,753 B2 | 9/2016 | Kim |
| 9,635,757 B1 | 4/2017 | Chen et al. |
| 10,070,533 B2 | 9/2018 | Flemming et al. |
| 2001/0051584 A1 | 12/2001 | Harada et al. |
| 2002/0015546 A1 | 2/2002 | Bhagavatula |
| 2002/0086246 A1 | 7/2002 | Lee |
| 2002/0100608 A1 | 8/2002 | Fushie et al. |
| 2003/0025227 A1 | 2/2003 | Daniell |
| 2003/0124716 A1 | 7/2003 | Hess et al. |
| 2003/0135201 A1 | 7/2003 | Gonnelli |
| 2003/0156819 A1 | 8/2003 | Pruss et al. |
| 2003/0174944 A1 | 9/2003 | Dannoux |
| 2003/0228682 A1 | 12/2003 | Lakowicz et al. |
| 2003/0231830 A1 | 12/2003 | Hikichi |
| 2004/0008391 A1 | 1/2004 | Bowley et al. |
| 2004/0020690 A1 | 2/2004 | Parker et al. |
| 2004/0155748 A1 | 8/2004 | Steingroever |
| 2004/0171076 A1 | 9/2004 | Dejneka et al. |
| 2004/0184705 A1 | 9/2004 | Shimada et al. |
| 2004/0198582 A1 | 10/2004 | Borelli et al. |
| 2005/0089901 A1 | 4/2005 | Porter et al. |
| 2005/0105860 A1 | 5/2005 | Oono |
| 2005/0150683 A1 | 7/2005 | Farnworth et al. |
| 2005/0170670 A1 | 8/2005 | King et al. |
| 2005/0277550 A1 | 12/2005 | Brown et al. |
| 2006/0118965 A1 | 6/2006 | Matsui |
| 2006/0147344 A1 | 7/2006 | Ahn et al. |
| 2006/0158300 A1 | 7/2006 | Korony et al. |
| 2006/0159916 A1 | 7/2006 | Debrow et al. |
| 2006/0177855 A1 | 8/2006 | Utermohlen et al. |
| 2006/0188907 A1 | 8/2006 | Lee et al. |
| 2006/0193214 A1 | 8/2006 | Shimano et al. |
| 2006/0283948 A1 | 12/2006 | Naito |
| 2007/0120263 A1 | 5/2007 | Gabric et al. |
| 2007/0121263 A1 | 5/2007 | Liu et al. |
| 2007/0155021 A1 | 7/2007 | Zhang et al. |
| 2007/0158787 A1 | 7/2007 | Chanchani |
| 2007/0248126 A1 | 10/2007 | Liu et al. |
| 2007/0267708 A1 | 11/2007 | Courcimault |
| 2007/0272829 A1 | 11/2007 | Nakagawa et al. |
| 2007/0296520 A1 | 12/2007 | Hosokawa et al. |
| 2008/0136572 A1 | 6/2008 | Ayasi et al. |
| 2008/0174976 A1 | 7/2008 | Satoh et al. |
| 2008/0182079 A1 | 7/2008 | Mirkin et al. |
| 2008/0223603 A1 | 9/2008 | Kim et al. |
| 2008/0226228 A1 | 9/2008 | Tamura |
| 2008/0245109 A1 | 10/2008 | Flemming et al. |
| 2008/0291442 A1 | 11/2008 | Lawandy |
| 2008/0305268 A1 | 12/2008 | Norman et al. |
| 2009/0029185 A1 | 1/2009 | Lee et al. |
| 2009/0075478 A1 | 3/2009 | Matsui |
| 2009/0130736 A1 | 5/2009 | Collis et al. |
| 2009/0170032 A1 | 7/2009 | Takahashi et al. |
| 2009/0182720 A1 | 7/2009 | Cain et al. |
| 2009/0243783 A1 | 10/2009 | Fouquet et al. |
| 2010/0022416 A1 | 1/2010 | Flemminng et al. |
| 2010/0237462 A1 | 9/2010 | Beker et al. |
| 2011/0003422 A1 | 1/2011 | Katragadda et al. |
| 2011/0045284 A1 | 2/2011 | Matsukawa et al. |
| 2011/0065662 A1 | 3/2011 | Rinsch et al. |
| 2011/0108525 A1 | 5/2011 | Chien et al. |
| 2011/0170273 A1 | 7/2011 | Helvajian |
| 2011/0195360 A1 | 8/2011 | Flemming et al. |
| 2011/0217657 A1 | 9/2011 | Flemming et al. |
| 2011/0284725 A1 | 11/2011 | Goldberg |
| 2011/0304999 A1 | 12/2011 | Yu et al. |
| 2012/0080612 A1 | 4/2012 | Grego |
| 2012/0161330 A1 | 6/2012 | Hlad et al. |
| 2013/0119401 A1 | 5/2013 | D'Evelyn et al. |
| 2013/0142998 A1 | 6/2013 | Flemming et al. |
| 2013/0183805 A1* | 7/2013 | Wong ............... H01L 27/10861 438/387 |
| 2013/0278568 A1 | 10/2013 | Lasiter et al. |
| 2013/0337604 A1 | 12/2013 | Ozawa et al. |
| 2014/0002906 A1 | 1/2014 | Shibuya |
| 2014/0035892 A1 | 2/2014 | Shenoy |

(56) References Cited

U.S. PATENT DOCUMENTS

| | | |
|---|---|---|
| 2014/0035935 A1 | 2/2014 | Shenoy et al. |
| 2014/0070380 A1 | 3/2014 | Chiu et al. |
| 2014/0104284 A1 | 4/2014 | Shenoy et al. |
| 2014/0144681 A1 | 5/2014 | Pushparaj et al. |
| 2014/0145326 A1 | 5/2014 | Lin et al. |
| 2014/0169746 A1 | 6/2014 | Hung et al. |
| 2014/0203891 A1 | 7/2014 | Yazaki |
| 2014/0247269 A1 | 9/2014 | Berdy et al. |
| 2014/0272688 A1 | 9/2014 | Dillion |
| 2014/0367695 A1 | 12/2014 | Barlow |
| 2015/0048901 A1 | 2/2015 | Rogers |
| 2015/0071593 A1 | 3/2015 | Kanke |
| 2015/0210074 A1 | 7/2015 | Chen et al. |
| 2015/0263429 A1 | 9/2015 | Vahidpour et al. |
| 2015/0277047 A1 | 10/2015 | Flemming et al. |
| 2016/0048079 A1 | 2/2016 | Lee et al. |
| 2016/0181211 A1 | 6/2016 | Kamagaing et al. |
| 2016/0254579 A1 | 9/2016 | Mills |
| 2016/0265974 A1 | 9/2016 | Erte et al. |
| 2016/0320568 A1 | 11/2016 | Haase |
| 2016/0380614 A1 | 12/2016 | Abbott et al. |
| 2017/0003421 A1 | 1/2017 | Flemming et al. |
| 2017/0077892 A1 | 3/2017 | Thorup |
| 2017/0094794 A1 | 3/2017 | Flemming et al. |
| 2017/0098501 A1 | 4/2017 | Flemming et al. |
| 2017/0213762 A1 | 7/2017 | Gouk |
| 2018/0323485 A1 | 11/2018 | Gnanou et al. |
| 2020/0275558 A1* | 8/2020 | Fujita .................. H05K 3/42 |

FOREIGN PATENT DOCUMENTS

| | | |
|---|---|---|
| DE | 102004059252 | 6/2006 |
| EP | 0311274 | 12/1989 |
| EP | 0507719 A1 | 10/1992 |
| EP | 0949648 A1 | 10/1999 |
| EP | 1683571 | 6/2006 |
| JP | 56-155587 | 12/1981 |
| JP | 61231529 A | 10/1986 |
| JP | 63-128699 A | 6/1988 |
| JP | H393683 A | 4/1991 |
| JP | 05139787 A | 6/1993 |
| JP | 08179155 | 12/1994 |
| JP | 10007435 A | 1/1998 |
| JP | 10199728 A | 7/1998 |
| JP | 11344648 A | 12/1999 |
| JP | 2000228615 | 8/2000 |
| JP | 2001033664 A | 2/2001 |
| JP | 2001206735 A | 7/2001 |
| JP | 2005215644 | 11/2005 |
| JP | 2008252797 A | 10/2008 |
| JP | 2012079960 A | 4/2012 |
| JP | 2013062473 A | 4/2013 |
| JP | 2013217989 A | 10/2013 |
| JP | 2014241365 A | 12/2014 |
| JP | 2015028651 | 2/2015 |
| JP | 2015028651 A | 2/2015 |
| JP | H08026767 | 1/2016 |
| JP | 2018200912 A | 12/2018 |
| KR | 100941691 B1 | 2/2010 |
| KR | 101167691 | 7/2012 |
| WO | 2007088058 A2 | 8/2007 |
| WO | 2008119080 | 10/2008 |
| WO | 2008154931 | 12/2008 |
| WO | 2009029733 | 3/2009 |
| WO | 2009062011 | 5/2009 |
| WO | 2009126649 | 10/2009 |
| WO | 2010011939 | 1/2010 |
| WO | 2011100445 | 8/2011 |
| WO | 20111109648 | 9/2011 |
| WO | 2012078213 A1 | 6/2012 |
| WO | 2014062226 | 1/2014 |
| WO | 2014062226 A1 | 1/2014 |
| WO | 2014043267 | 3/2014 |
| WO | 2014062311 | 4/2014 |
| WO | 2015108648 A1 | 7/2015 |
| WO | 2015112903 | 7/2015 |
| WO | 2015171597 | 11/2015 |
| WO | 2017132280 | 8/2017 |
| WO | 2017147511 | 8/2017 |
| WO | 2017147511 A1 | 8/2017 |
| WO | 2017177171 | 10/2017 |

OTHER PUBLICATIONS

Hyeon, I-J, et al., "Millimeter-Wave Substrate Integrated Waveguide Using Micromachined Tungsten-Coated Through Glass Silicon Via Structures," Micromachines, vol. 9, 172 Apr. 9, 2018, 9 pp.

International Search Report and Written Opinion for PCT/US2020/026673 dated Jun. 22, 2020, by the USPTO, 13 pp.

Mohamedelhassan, A., "Fabrication of Ridge Waveguides in Lithium Niobate," Independent thesis Advanced level, KTH, School of Engineering Sciences, Physics, 2012, 68 pp.

Muharram, B., Thesis from University of Calgary Graduate Studies, "Substrate-Integrated Waveguide Based Antenna in Remote Respiratory Sensing," 2012, 97 pp.

Chou, et al., "Design and Demonstration of Micro-mirrors and Lenses for Low Loss and Low Cost Single-Mode Fiber Coupling in 3D Glass Photonic Interposers," 2016 IEEE 66th Electronic Components and Technology Conference, May 31-Jun. 3, 7 pp.

European Search Report and Supplemental European Search Report for EP 18828907 dated Mar. 25, 2020, 11 pp.

International Search Report and Written Opinion for PCT/US2019/068586 dated Mar. 12, 2020 by USPTO, 10 pp.

International Search Report and Written Opinion for PCT/US2019/068590 dated Mar. 5, 2020 by USPTO, 9 pp.

International Search Report and Written Opinion for PCT/US2019/068593 dated Mar. 16, 2020 by USPTO, 8 pp.

Topper, et al., "Development of a high density glass interposer based on wafer level packaging technologies," 2014 IEEE 64th Electronic Components and Technology Conference, May 27, 2014, pp. 1498-1503.

International Search Report and Written Opinion of Australian Patent Office of PCT/US2019/024496 dated Jun. 20, 2019, 9 pp.

Extended European Search Report 17744848.7 dated Oct. 30, 2019, 9 pp.

Extended European Search Report 17757365.6 dated Oct. 14, 2019, 14 pp.

International Search Report and Written Opinion for PCT/US2019/50644 dated Dec. 4, 2019 by USPTO, 9 pp.

Kamagaing, et al., "Investigation of a photodefinable glass substrate for millimeter-wave radios on package," Proceeds of the 2014 IEEE 64th Electronic Components and Technology Conference, May 27, 2014, pp. 1610-1615.

Aslan, et al., "Metal-Enhanced Fluorescence: an emerging tool in biotechnology" Current opinion in Biotechnology (2005), 16:55-62.

Bakir, Muhannad S., et al., "Revolutionary Nanosilicon Ancillary Technologies for Ultimate-Performance Gigascale Systems," IEEE 2007 Custom Integrated Circuits Conference (CICC), 2007, pp. 421-428.

Beke, S., et al., "Fabrication of Transparent and Conductive Microdevices," Journal of Laser Micro/Nanoengineering (2012), 7(1):28-32.

Brusberg, et al. "Thin Glass Based Packaging Technologies for Optoelectronic Modules" Electronic Components and Technology Conference, May 26-29, 2009, pp. 207-212, DOI:10.1109/ECTC.2009.5074018, pp. 208-211; Figures 3, 8.

Cheng, et al. "Three-dimensional Femtosecond Laser Integration in Glasses" The Review of Laser Engineering, vol. 36, 2008, pp. 1206-1209, Section 2, Subsection 3.1.

Chowdhury, et al, "Metal-Enhanced Chemiluminescence", J Fluorescence (2006), 16:295-299.

Crawford, Gregory P., "Flexible Flat Panel Display Technology," John Wiley and Sons, NY, (2005), 9 pages.

Dang, et al. "Integrated thermal-fluidic I/O interconnects for an on-chip microchannel heat sink," IEEE Electron Device Letters, vol. 27, No. 2, pp. 117-119, 2006.

(56) References Cited

OTHER PUBLICATIONS

Dietrich, T.R., et al., "Fabrication Technologies for Microsystems Utilizing Photoetchable Glass," Microelectronic Engineering 30, (1996), pp. 407-504.
Extended European Search Report 15741032.5 dated Aug. 4, 2017, 11 pp.
Extended European Search Report 15789595.4 dated Mar. 31, 2017, 7 pp.
Geddes, et al, "Metal-Enhanced Fluorescence" J Fluorescence, (2002), 12:121-129.
Gomez-Morilla, et al. "Micropatterning of Foturan photosensitive glass following exposure to MeV proton beams" Journal of Micromechanics and Microengineering, vol. 15, 2005, pp. 706-709, DOI:10.1088/0960-1317/15/4/006.
Intel Corporation, "Intel® 82566 Layout Checklist (version 1.0)", 2006.
International Search Report and Written Opinion for PCT/US2008/058783 dated Jul. 1, 2008, 15 pp.
International Search Report and Written Opinion for PCT/US2008/074699 dated Feb. 26, 2009, 11 pp.
International Search Report and Written Opinion for PCT/US2009/039807 dated Nov. 24, 2009, 13 pp.
International Search Report and Written Opinion for PCT/US2009/051711 dated Mar. 5, 2010, 15 pp.
International Search Report and Written Opinion for PCT/US2011/024369 dated Mar. 25, 2011, 13 pp.
International Search Report and Written Opinion for PCT/US2013/059305 dated Jan. 10, 2014, 6 pp.
International Search Report and Written Opinion for PCT/US2015/012758 dated Apr. 8, 2015, 11 pp.
International Search Report and Written Opinion for PCT/US2015/029222 dated Jul. 22, 2015, 9 pp.
International Search Report and Written Opinion for PCT/US2017/019483 dated May 19, 2017, 11 pp.
International Search Report and Written Opinion for PCT/US2017/026662 dated Jun. 5, 2017, 11 pp.
International Search Report and Written Opinion for PCT/US2018/029559 dated Aug. 3, 2018, 9 pp.
International Technology Roadmap for Semiconductors, 2007 Edition, "Assembly and Packaging," 9 pages.
Lakowicz, et al; "Advances in Surface-Enhanced Fluorescence", J Fluorescence, (2004), 14:425-441.
Lewis, Sr., "Hawley's Condensed Chemical Dictionary." 13th ed, 1997, John Wiley and Sons. p. 231.
Lin, C.H., et al., "Fabrication of Microlens Arrays in Photosensitive Glass by Femtosecond Laser Direct Writing," Appl Phys A (2009) 97:751-757.
Livingston, F.E., et al., "Effect of Laser Parameters on the Exposure and Selective Etch Rate in Photostructurable Glass," SPIE vol. 4637 (2002); pp. 404-412.
Lyon, L.A., et al., "Raman Spectroscopy," Anal Chem (1998), 70:341R-361R.
Papapolymerou, I., et al., "Micromachined patch antennas," IEEE Transactions on Antennas and Propagation, vol. 46, No. 2, 1998, pp. 275-283.
Perro, A., et al., "Design and synthesis of Janus micro- and nanoparticles," J Mater Chem (2005), 15:3745-3760.
Quantum Leap, "Liquid Crystal Polymer (LCP) LDMOS Packages," Quantum Leap Datasheet, (2004), mlconnelly.com/QLPKG.Final_LDMOS_DataSheet.pdf, 2 pages.
Scrantom, Charles Q., "LTCC Technology—Where We Are and Where We're Going—IV," Jun. 2000, 12 pages.
TechNote #104, Bangs Laboratories, www.bangslabs.com/technotes/104.pdf, "Silica Microspheres".
TechNote #201, Bangs Laboratories, www.bangslabs.com/technotes/201.pdf, "Working with Microspheres".
TechNote #205, Bangs Laboratories, www.bangslabs.com/technotes/205.pdf, "Covalent Coupling".
Wang, et al. "Optical waveguide fabrication and integration with a micro-mirror inside photosensitive glass by femtosecond laser direct writing" Applied Physics A, vol. 88, 2007, pp. 699-704, DOI:10.1007/S00339-007-4030-9.
Zhang, H., et al., "Biofunctionalized Nanoarrays of Inorganic Structures Prepared by Dip-Pen Nanolithography," Nanotechnology (2003), 14:1113-1117.
Zhang, H., et al., Synthesis of Hierarchically Porous Silica and Metal Oxide Beads Using Emulsion-Templated Polymer Scaffolds, Chem Mater (2004), 16:4245-4256.
Azad, I., et al., "Design and Performance Analysis of 2.45 GHz Microwave Bandpass Filter with Reduced Harmonics," International Journal of Engineering Research and Development (2013), 5(11):57-67.
International Search Report and Written Opinion for PCT/US2018/039841 dated Sep. 20, 2018 by Australian Patent Office, 12 pp.
International Search Report and Written Opinion for PCT/US2018/065520 dated Mar. 20, 2019 by Australian Patent Office, 11 pp.
International Search Report and Written Opinion for PCT/US2018/068184 dated Mar. 19, 2019 by Australian Patent Office, 11 pp.
International Search Report and Written Opinion for PCT/US2019/024496 dated Jun. 20, 2019 by Australian Patent Office, 9 pp.
International Search Report and Written Opinion for PCT/US2019/34245 dated Aug. 9, 2019 by Australian Patent Office, 10 pp.
International Search Report and Written Opinion for PCT/US2020/28474 dated Jul. 17, 2020 by the USPTO, 7 pp.
European Search Report and Supplemental European Search Report for EP 18889385.3 dated Dec. 2, 2020, 8 pp.
European Search Report and Supplemental European Search Report for EP 18898912.3 dated Feb. 2, 2021, 10 pp.
Green, S., "Heterogeneous Integration of DARPA: Pathfinding and Progress in Assembly Approaches," viewed on and retrieved from the Internet on Feb. 26, 2021, <URL:https://web.archive.org/web/20181008153224/https://www.ectc.net/files/68/Demmin%20Darpa.pdf>, published Oct. 8, 2018 per the Wayback Machine.
International Search Report and Written Opinion for PCT/US2020/54394 dated Jan. 7, 2021 by the USPTO, 15 pp.

* cited by examiner

RF INTEGRATED POWER CONDITION CAPACITOR

CROSS-REFERENCE TO RELATED APPLICATIONS

This application is the National Stage of International Application No. PCT/US2019/024496, filed on Mar. 28, 2019 claiming the priority to U.S. Provisional Application No. 62/655,618 filed on Apr. 10, 2018, the contents of each of which are incorporated by reference herein.

TECHNICAL FIELD OF THE INVENTION

The present invention relates to creating an integrated RF power conditioning capacitor.

BACKGROUND OF THE INVENTION

Without limiting the scope of the invention, its background is described in connection with power condition capacitors.

RF devices are using higher and higher power. This class of RF devices produce pulses at voltages greater that 10 V and at currents greater than 2 Amps. Switching the signal on and off at this level of current and voltage creates a significant amount of harmonic signals. These harmonic signals can disrupt the operation of the circuit. Large value integrated silicon based capacitors fail to achieve the required capacitance and suffer from dielectric breakdown.

SUMMARY OF THE INVENTION

The present inventors have developed integrated photodefinable glass-ceramics that can be converted from a glass phase to a ceramic phase through a combination of ultraviolet light exposure and thermal treatments. The selective application of the ultraviolet light exposure using a photo mask or shadow mask creates regions of ceramic material in the photodefinable glass. The present invention includes a method to fabricate a substrate with one or more, two or three-dimensional capacitive devices by preparing a photosensitive glass substrate with high surface area structures, dielectric material and coating with one or more metals.

In one embodiment of the present invention, a method of making an integrated large capacitance in a small form factor for power conditioning on a photodefinable glass includes: depositing a conductive seed layer on a photodefinable glass processed to form one or more via openings in the photodefinable glass; placing the photodefinable glass substrate with a metallized seed layer electroplating metal to fill one or more openings in the photodefinable glass substrate to form vias; chemically-mechanically polishing a front and a back surface of the photodefinable glass substrate to leave only the filled vias; exposing and converting at least one rectangular portion of the photosensitive glass substrate around two adjacent filled vias; etching the rectangular patent exposing at least one pair of adjacent filled vias to form metal posts; flash coating a non-oxidizing layer on the metal posts that form a first electrode; depositing a dielectric layer on or around the posts; metal coating the dielectric layer to form a second electrode; connecting a first metal layer to all of the first electrodes in parallel to form a single electrode for a capacitor; and connecting a second metal layer to all of the second electrodes in parallel to form a second electrode for the capacitor. In one aspect, the dielectric layer is a thin film between 0.5 nm and 1000 nm thick. In another aspect, the dielectric layer is a sintered paste between 0.05 µm and 100 µm thick. In another aspect, the dielectric layer has an electrical permittivity between 10 and 10,000. In another aspect, the dielectric layer has an electrical permittivity between 2 and 100. In another aspect, the dielectric layer is deposited by ALD. In another aspect, the dielectric layer is deposited by doctor blading. In another aspect, the capacitor has a capacitance density greater than 1,000 pf/mm$^2$.

In another embodiment of the present invention, a method of making an integrated large capacitance in a small form factor for power conditioning on a photodefinable glass substrate includes: masking a circular pattern on the photosensitive glass substrate; exposing at least one portion of the photosensitive glass substrate to an activating UV energy source; heating the photosensitive glass substrate to a heating phase of at least ten minutes above its glass transition temperature; cooling the photosensitive glass substrate to transform at least part of the exposed glass to a crystalline material to form a glass—ceramic crystalline substrate; partially etching away the ceramic phase of the photodefinable glass substrate with an etchant solution; depositing a conductive seed layer on the photodefinable glass; placing the photodefinable glass substrate with a metallized seed layer electroplating metal to fill one or more openings in the photodefinable glass substrate to form vias; chemically-mechanically polishing a front and a back surface of the photodefinable glass substrate to leave only the filled vias; exposing and converting at least one rectangular portion of the photosensitive glass substrate around two adjacent filled vias; etching the rectangular patent exposing at least one pair of adjacent filled vias to form metal posts; flash coating a non-oxidizing layer on the metal posts that form a first electrode; depositing a dielectric layer on or around the posts; metal coating the dielectric layer to form a second electrode; connecting a first metal layer to all of the first electrodes in parallel to form a single electrode for a capacitor; and connecting a second metal layer to all of the second electrodes in parallel to form a second electrode for a capacitor. In one aspect, the dielectric layer is a thin film between 0.5 nm and 1000 nm thick. In another aspect, the dielectric layer is a sintered paste between 0.05 µm and 100 µm thick. In another aspect, the dielectric layer has an electrical permittivity between 10 and 10,000. In another aspect, the dielectric layer has an electrical permittivity between 2 and 100. In another aspect, the dielectric layer is deposited by ALD. In another aspect, the dielectric layer is deposited by doctor blading. In another aspect, the capacitor has a capacitance density greater than 1,000 pf/mm$^2$.

Yet another embodiment of the present invention includes an integrated capacitor made by a method including: masking a circular pattern on a photosensitive glass substrate; exposing at least one portion of the photosensitive glass substrate to an activating UV energy source; heating the photosensitive glass substrate to a heating phase of at least ten minutes above its glass transition temperature; cooling the photosensitive glass substrate to transform at least part of the exposed glass to a crystalline material to form a glass— ceramic crystalline substrate; partially etching away the ceramic phase of the photodefinable glass substrate with an etchant solution; depositing a conductive seed layer on the photodefinable glass; placing the photodefinable glass substrate with a metallized seed layer electroplating metal to fill one or more openings in the photodefinable glass substrate to form vias; chemically-mechanically polishing a front and a back surface of the photodefinable glass substrate to leave only the filled vias; exposing and converting at least one rectangular portion of the photosensitive glass substrate around two adjacent filled vias; etching the rectangular patent exposing at least one pair of adjacent filled vias to form metal posts; flash coating a non-oxidizing layer on the metal posts that form a first electrode; depositing a dielectric layer on or around the posts; metal coating the dielectric layer to form a second electrode; connecting a first metal layer to all of the first electrodes in parallel to form a single electrode for a capacitor; and connecting a second metal layer to all of the second electrodes in parallel to form a second electrode for the capacitor. In one aspect, the dielectric layer is a thin film between 0.5 nm and 1000 nm thick. In another aspect, the dielectric layer is a sintered paste between 0.05 µm and 100 µm thick. In another aspect, the dielectric material has an electrical permittivity between 10 and 10,000. In another aspect, the dielectric thin film has an electrical permittivity between 2 and 100. In another aspect, the dielectric thin film material is deposited by ALD. In another aspect, the dielectric paste material is deposited by doctor blading. In another aspect, the capacitor has a capacitance density greater than 1,000 pf/mm$^2$.

BRIEF DESCRIPTION OF THE DRAWINGS

For a more complete understanding of the features and advantages of the present invention, reference is now made to the detailed description of the invention along with the accompanying figures and in which.

DETAILED DESCRIPTION OF THE INVENTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not limit the invention, except as outlined in the claims.

Photodefinable glass materials are processed using first generation semiconductor equipment in a simple three step process where the final material can be fashioned into either glass, ceramic, or contain regions of both glass and ceramic. Photodefinable glass has several advantages for the fabrication of a wide variety of microsystems components, systems on a chip and systems in a package. Microstructures and electronic components have been produced relatively inexpensively with these types of glass using conventional semiconductor and printed circuit board (PCB) processing equipment. In general, glass has high temperature stability, good mechanical and electrically properties, and a better chemical resistance than plastics as well as many types of metals.

When exposed to UV-light within the absorption band of cerium oxide, the cerium oxide acts as a sensitizer by absorbing a photon and losing an electron. This reaction reduces neighboring silver oxide to form silver atoms, e.g., $Ce^{3+}Ag^+=\square Ce^{4+}+Ag^0$ The silver ions coalesce into silver nano-clusters during the heat treatment process and induce nucleation sites for the formation of a crystalline ceramic phase in the surrounding glass. This heat treatment must be performed at a temperature near the glass transformation temperature. The ceramic crystalline phase is more soluble in etchants, such as hydrofluoric acid (HF), than the unexposed vitreous, amorphous glassy regions. In particular, the crystalline [ceramic] regions of FOTURAN® are etched about 20 times faster than the amorphous regions in 10% HF, enabling microstructures with wall slope ratios of about 20:1 when the exposed regions are removed. See T. R. Dietrich et al., "Fabrication technologies for microsystems utilizing photo-etchable glass," Microelectronic Engineering 30, 497 (1996), which is incorporated herein by reference. Other compositions of photodefinable glass will etch at different rates.

One method of fabricating a metal device using a photosensitive glass substrate—comprised of silica, lithium oxide, aluminum oxide and cerium oxide—involves the use of a mask and UV light to create a pattern with at least one, 2-dimensional or 3-dimensional, ceramic phase region within the photosensitive glass substrate.

Preferably, the shaped glass structure contains at least one or more, two or three dimensional inductive device. The capacitive device is formed by making a series of connected structures to form a high surface area capacitor for power condition. The structures can be either rectangular, circular, elliptical, fractal or other shapes that create a pattern that generates capacitance. The patterned regions of the APEX™ glass can be filled with metal, alloys, composites, glass or other magnetic media, by a number of methods including plating or vapor phase deposition. The electrical permittivity of the media combined with the dimensions, high surface area and number of structures in the device provide the inductance of devices. Depending on the frequency of operation the inductive device design will require different magnetic permittivity materials, so at higher frequency operations material such as copper or other similar material is the media of choice for inductive devices. Once the capacitive device has been generated the supporting APEX™ glass can be left in place or removed to create an array of capacitive structures that can be attached in series or in parallel.

This process can be used to create a large surface area capacitor that will exceed the desired technical requirements for an integrated power conditioning capacitance density with values of greater than or equal to 1 nf per mm$^2$. There are different device architectures based on the relative permittivity used and the preferred deposition technique for the dielectric material. This invention provides a method to create a device architectures for each dielectric material.

Generally, glass ceramics materials have had limited success in microstructure formation plagued by performance, uniformity, usability by others and availability issues. Past glass-ceramic materials have yielded an etch aspect-ratio of approximately 15:1, in contrast APEX® glass has an average etch aspect ratio greater than 50:1. This allows users to create smaller and deeper features. Additionally, our manufacturing process enables product yields of greater than 90% (legacy glass yields are closer to 50%). Lastly, in legacy glass ceramics, approximately only 30% of the glass is converted into the ceramic state, whereas with APEX® glass ceramic this conversion is closer to 70%.

The APEX® composition provides three main mechanisms for its enhanced performance: (1) the higher amount of silver leads to the formation of smaller ceramic crystals which are etched faster at the grain boundaries, (2) the decrease in silica content (the main constituent etched by the HF acid) decreases the undesired etching of unexposed material, and (3) the higher total weight percent of the alkali metals and boron oxide produces a much more homogeneous glass during manufacturing.

Ceramicization of the glass is accomplished by exposing the entire glass substrate to approximately 20 J/cm$^2$ of 310 nm light. When trying to create glass spaces within the ceramic, users expose all of the material, except where the glass is to remain glass. In one embodiment, the present invention provides a quartz/chrome mask containing a variety of concentric circles with different diameters.

Previous high surface area capacitors demonstrated by the inventors use thin film metalized via using a CVD process. The metalized via is then coated with a thin film of dielectric material such as a 20 nm layer of $Al_2O_3$ using an ALD process then applying a top metallization to make a large capacitance due to the effect surface area of the via(s) and the ultra thin coating of the dielectric.

The present invention includes a method for fabricating an inductive device in or on glass ceramic structure electrical microwave and radio frequency applications. The glass ceramic substrate may be a photosensitive glass substrate having a wide number of compositional variations including but not limited to: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O_3$ and $Al_2O_3$ not exceeding 13 weight %; 8-15 weight % $Li_2O$; and 0.001-0.1 weight % $CeO_2$. This and other varied compositions are generally referred to as the APEX® glass.

Figure 1:
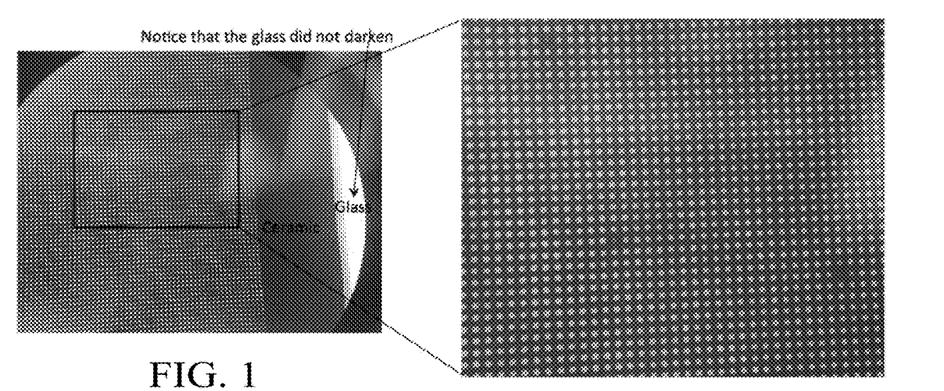
FIG. 1 shows the image of copper electroplated filled through hole via with seed layer.

The exposed portion of the glass may be transformed into a crystalline material by heating the glass substrate to a temperature near the glass transformation temperature. When etching the glass substrate in an etchant such as hydrofluoric acid, the anisotropic-etch ratio of the exposed portion to the unexposed portion is at least 30:1 when the glass is exposed to a broad spectrum mid-ultraviolet (about 308-312 nm) flood lamp to provide a shaped glass structure that has an aspect ratio of at least 30:1, and to create an inductive structure. The mask for the exposure can be of a halftone mask that provides a continuous grey scale to the exposure to form a curved structure for the creation of an inductive structure/device. A digital mask can also be used with the flood exposure and can be used to produce the creation of an inductive structure/device. The exposed glass is then baked, typically in a two-step process. Temperature range heated between 420° C.-520° C. for between 10 minutes to 2 hours, for the coalescing of silver ions into silver nanoparticles and temperature range heated between 520° C.-620° C. for between 10 minutes and 2 hours allowing the lithium oxide to form around the silver nanoparticles. The glass plate is then etched. The glass substrate is etched in an etchant, of HF solution, typically 5% to 10% by volume, wherein the etch ratio of exposed portion to that of the unexposed portion is at least 30:1 when exposed with a broad spectrum mid-ultraviolet flood light, and greater than 30:1 when exposed with a laser, to provide a shaped glass structure with an anisotropic-etch ratio of at least 30:1. FIG. 1 shows the image of copper electroplated filled through hole via with seed layer.

Figure 2A:
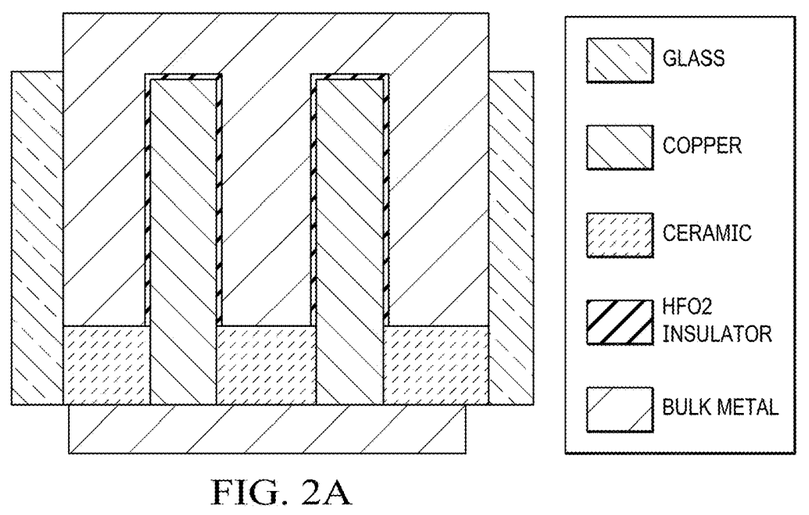
FIG. 2A shows a cross section of the RF power conditioning capacitor and the materials key where the dielectric material is HfO$_2$.
Figure 2B:
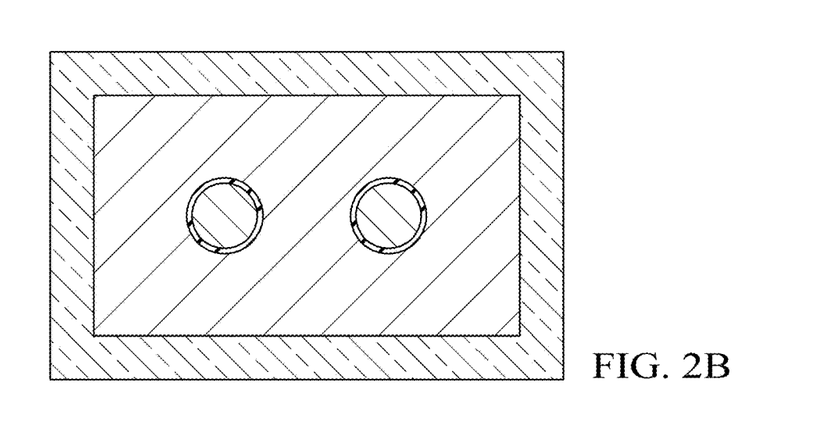
FIG. 2B shows a top view of the RF power conditioning capacitor.

The present invention includes capacitive structures created in the multiple metal posts in a glass-ceramic substrate, such process employing the photodefinable glass structure in a wafer containing at least one or more, two or three-dimensional capacitor device. The photodefinable glass wafer can range from 50 μm to 1,000 μm, in our case preferably 250 μm. The photodefinable glass is then patterned with a circular pattern and etched through the volume of the glass. The circular pattern can range from 5 μm to 250 μm in diameter but is preferably 30 μm in diameter. A uniform titanium seed layer is deposited across the wafer including the vias by a CVD process. The seed layer thickness can range from 50 nm to 1000 nm but is preferably 150 nm in thickness. The wafer is then placed into an electroplating bath where copper (Cu) is deposited on the seed layer. The copper layer needs to be sufficient to fill the via, in this case 25 μm. The front side and backside of the wafer is the lapped and polished back to the photodefinable glass. This can be seen in FIG. 2A. A rectangular pattern is made in the photodefinable glass using the process described earlier to convert between 10% and 90% of the glass, preferably 80% of the volume of the photodefinable glass. The via may also receive an additional low concentrated rinse, with an etchant, such as dilute HF. The dilute HF will pattern or texture the ceramic wall of the via. The texturing of the ceramic wall significantly increases the surface area of the structure, directly increasing the capacitance of the device. The photodefinable glass with the exposed copper has a metalized polyimide is placed in physical/electrical contact to the copper filled via on the backside of the wafer. The metalized polyimide contacted photodefinable glass with the exposed copper columns are placed into a electroplating bath where a flash coating of non-oxidizing metal or a metal that forms a semiconductor oxide or conductive oxide is electroplated on the surface of the metal posts. This metal is preferably gold (Au). The thin flash coating prevents the oxidation of the copper posts during the deposition of the dielectric media/material. The dielectric is deposited using an atomic layer deposition (ALD) process to deposit a metal that can be oxidized or directly deposit a oxide material such as 10 Å of the dielectric layer of $Ta_2O_5$, $Al_2O_3$ or other vapor phase dielectrics including but not limited to $Al_2O_3$. $Al_2O_3$ at 380° C. using TMA and $O_3$—cycle time: 3.5 s. The $Al_2O_3$ layer is then heated in oxygen ambient to 300° C. for 5 min fully oxidized the dielectric layer. The thickness of this dielectric layer can range from 5 nm to 1000 nm. Our preferred thickness is 5 nm thick as can be seen in FIG. 2A. Next a RLD of copper is deposited to fill the rectangular hole. The RLD is preferably a copper paste that is deposited by a silk screening process. The wafer is then placed into a furnace that is heated to between 450° C. to 700° C. for between 5 and 60 min in an inert gas or vacuum environment. Our preferred temperature and time is 600° C. for 20 min in argon gas. The last step is to make contact to the RLD copper making the front surface of the die into rows and backside of the wafer into columns. All of the rows on the front surface are tied together in parallel to make an electrode for a large integrated surface area capacitor. Similarly all of the columns on the back surface of the die are tied together in parallel to make a bottom electrode for a large integrated surface area capacitor. FIG. 2B shows a top view of the RF power conditioning capacitor.

Figure 3:
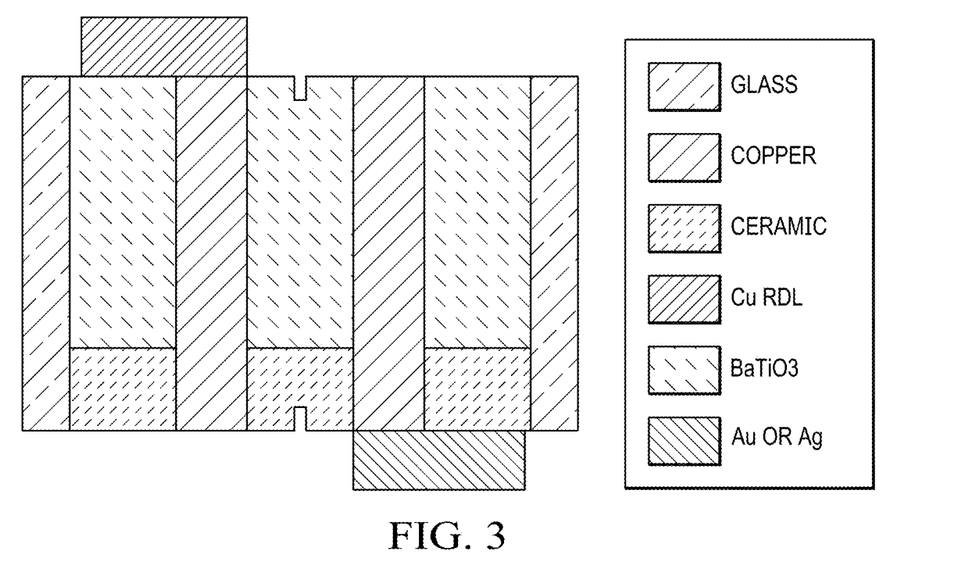
FIG. 3 shows a BaTiO$_3$ based integrated power condition capacitor.

A second embodiment can be seen in FIG. 3. The present invention includes capacitive structures created in the multiple metal posts in a glass-ceramic substrate, such process employing the photodefinable glass structure in a wafer containing at least one or more, two or three-dimensional capacitor device. The photodefinable glass wafer can range from 50 μm to 1,000 μm, in our case preferably 250 μm. The photodefinable glass is then patterned with a circular pattern and etched through the volume of the glass. The circular pattern can range from 5 μm to 250 μm in diameter but preferably 30 μm in diameter. A uniform titanium seed layer is deposited across the wafer including the vias by a CVD process. The seed layer thickness can range from 50 nm to 1000 nm, but is preferably 150 nm in thickness. The wafer is then placed into an electroplating bath where copper (Cu) is deposited on the seed layer. The copper layer needs to be sufficient to fill the via, in this case 25 μm. The front side and backside of the wafer is the lapped and polished back to the photodefinable glass. This can be seen in FIG. 3. A rectangular pattern is made in the photodefinable glass using the process described earlier to convert between 10% and 90% of the glass, preferably 80% of the volume of the photodefinable glass. The via may also receive an additional low concentrated rinse, with an etchant, such as dilute HF. The metalized polyimide contacted photodefinable glass with the exposed copper columns are placed into a electroplating bath where a flash coating of non-oxidizing metal or a metal that forms a semiconductor oxide or conductive oxide is electroplated on the surface of the metal posts. This metal is preferably gold (Au). The thin flash coating prevents the oxidation of the copper posts during the deposition of the dielectric media/material. A dielectric region is then created by use of commercially available $BaTiO_3$ paste that is silk-screened into the rectangular wells. The wafer is then placed into a furnace that is heated to between 450° C. to 700° C. for between 5 and 60 min in an oxygen ambient. A preferred temperature and time is 600° C. for 30 min in oxygen ambient. The last step is to make contact to the RLD copper making the front surface of the die into rows and backside of the wafer into rows that are parallel to the top electrodes. All of the rows on the front surface are tied together in parallel to make an electrode for a large integrated surface area capacitor. Similarly all of the rows on the back surface of the die are tied together in parallel to make a bottom electrode for a large integrated surface area capacitor.

Figure 4:
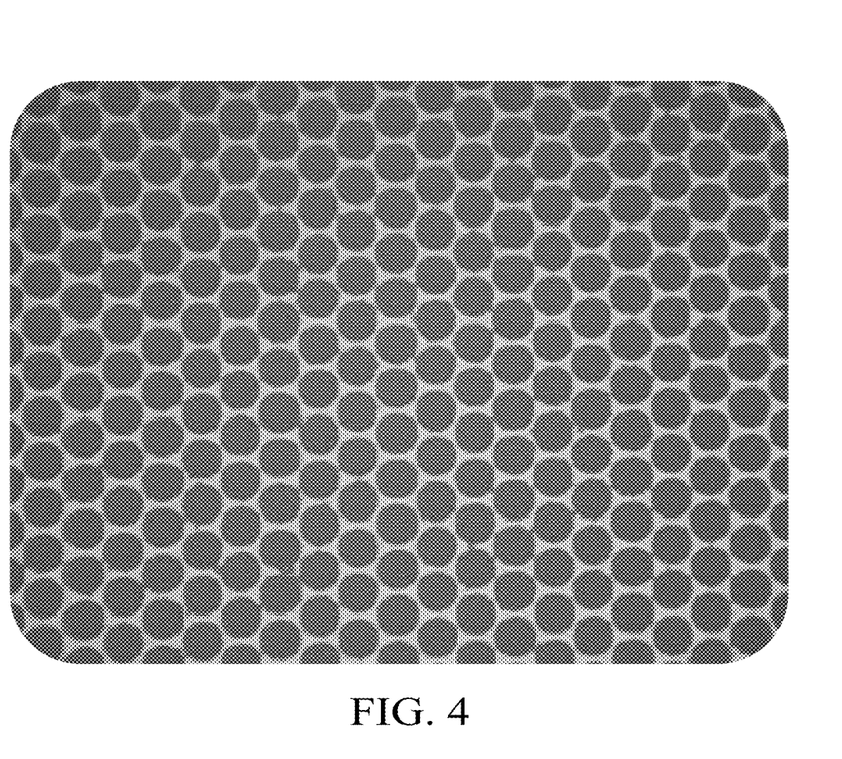
FIG. 4 shows a through hole via with 65 µm diameter, 72 µm center-to-center pitch.

FIG. 4 shows a through hole via with 65 μm diameter, 72 μm center-to-center pitch.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

This invention creates a cost effective glass ceramic three-dimensional capacitor structure or three-dimensional capacitor array device. Where a glass ceramic substrate has demonstrated capability to form such structures through the processing of both the vertical as well as horizontal planes either separately or at the same time to form two or three-dimensional capacitive devices.

The present invention includes a method to fabricate a substrate with one or more, two or three dimensional capacitor devices by preparing a photosensitive glass substrate with via or post and further coating or filling with one or more conductive layer typically a metal, dielectric material and a top layer conductive layer typically a metal.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not restrict the scope of the invention.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), property(ies), method/process steps or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

To aid the Patent Office, and any readers of any patent issued on this application in interpreting the claims appended hereto, applicants wish to note that they do not intend any of the appended claims to invoke paragraph 6 of 35 U.S.C. § 112, U.S.C. § 112 paragraph (f), or equivalent, as it exists on the date of filing hereof unless the words "means for" or "step for" are explicitly used in the particular claim.

For each of the claims, each dependent claim can depend both from the independent claim and from each of the prior dependent claims for each and every claim so long as the prior claim provides a proper antecedent basis for a claim term or element.

What is claimed is:

1. A method of making an integrated large capacitance in a small form factor for power conditioning on a photodefinable glass comprising:
   depositing a conductive seed layer on a photodefinable glass processed to form one or more via openings in the photodefinable glass;
   placing the photodefinable glass substrate with a metallized seed layer electroplating metal to fill one or more openings in the photodefinable glass substrate to form vias;
   chemically-mechanically polishing a front and a back surface of the photodefinable glass substrate to leave only the filled vias;
   exposing and converting at least one rectangular portion of the photosensitive glass substrate around two adjacent filled vias;
   etching the rectangular portion exposing at least one pair of adjacent filled vias to form metal posts;
   flash coating a non-oxidizing layer on the metal posts that form a first electrode;
   depositing a dielectric layer on or around the posts;
   metal coating the dielectric layer to form a second electrode;
   connecting a first metal layer to all of the first electrodes in parallel to form an inner electrode for a capacitor; and
   connecting a second metal layer to all of the second electrodes in parallel to form an outer electrode for the capacitor.

2. The method of claim 1, wherein the dielectric layer is a thin film between 0.5 nm and 1000 nm thick.

3. The method of claim 1, wherein the dielectric layer is a sintered paste between 0.05 μm and 100 μm thick.

4. The method of claim 1, wherein the dielectric layer has an electrical permittivity between 10 and 10,000.

5. The method of claim 1, wherein the dielectric layer has an electrical permittivity between 2 and 100.

6. The method of claim 1, wherein the dielectric layer is deposited by ALD.

7. The method of claim 1, wherein the dielectric layer is deposited by doctor blading.

8. The method of claim 1, wherein the capacitor has a capacitance density greater than 1,000 pf/mm$^2$.

9. A method of making an integrated large capacitance in a small form factor for power conditioning on a photodefinable glass substrate comprising:
   masking a circular pattern on the photosensitive glass substrate; exposing at least one portion of the photosensitive glass substrate to an activating UV energy source;
   heating the photosensitive glass substrate to a heating phase of at least ten minutes above its glass transition temperature;
   cooling the photosensitive glass substrate to transform at least part of the exposed glass to a crystalline material to form a glass—ceramic crystalline substrate;
   partially etching away the ceramic phase of the photodefinable glass substrate with an etchant solution;
   depositing a conductive seed layer on the photodefinable glass;

placing the photodefinable glass substrate with a metallized seed layer electroplating metal to fill one or more openings in the photodefinable glass substrate to form vias;

chemically-mechanically polishing a front and a back surface of the photodefinable glass substrate to leave only the filled vias;

exposing and converting at least one rectangular portion of the photosensitive glass substrate around two adjacent filled vias;

etching the rectangular portion exposing at least one pair of adjacent filled vias to form metal posts;

flash coating a non-oxidizing layer on the metal posts that form a first electrode;

depositing a dielectric layer on or around the posts;

metal coating the dielectric layer to form a second electrode;

connecting a first metal layer to all of the first electrodes in parallel to form an inner electrode for a capacitor; and connecting a second metal layer to all of the second electrodes in parallel to form an outer electrode for the capacitor.

10. The method of claim 9, wherein the dielectric layer is a thin film between 0.5 nm and 100 nm thick.

11. The method of claim 9, wherein the dielectric layer is a sintered paste between 0.05 μm and 100 μm thick.

12. The method of claim 9, wherein the dielectric layer has an electrical permittivity between 10 and 10,000.

13. The method of claim 9, wherein the dielectric layer has an electrical permittivity between 2 and 100.

14. The method of claim 9, wherein the dielectric layer is deposited by ALD.

15. The method of claim 9, wherein the dielectric layer is deposited by doctor blading.

16. The method of claim 9, wherein the capacitor has a capacitance density greater than 1,000 pf/mm².

17. An integrated capacitor made by a method comprising:

masking a circular pattern on a photosensitive glass substrate;

exposing at least one portion of the photosensitive glass substrate to an activating UV energy source;

heating the photosensitive glass substrate to a heating phase of at least ten minutes above its glass transition temperature;

cooling the photosensitive glass substrate to transform at least part of the exposed glass to a crystalline material to form a glass—ceramic crystalline substrate;

partially etching away the ceramic phase of the photodefinable glass substrate with an etchant solution;

depositing a conductive seed layer on the photodefinable glass; placing the photodefinable glass substrate with a metallized seed layer electroplating metal to fill one or more openings in the photodefinable glass substrate to form vias;

chemically-mechanically polishing a front and a back surface of the photodefinable glass substrate to leave only the filled vias;

exposing and converting at least one rectangular portion of the photosensitive glass substrate around two adjacent filled vias;

etching the rectangular portion exposing at least one pair of adjacent filled vias to form metal posts;

flash coating a non-oxidizing layer on the metal posts that form a first electrode;

depositing a dielectric layer on or around the posts;

metal coating the dielectric layer to form a second electrode;

connecting a first metal layer to all of the first electrodes in parallel to form an inner electrode for a capacitor; and connecting a second metal layer to all of the second electrodes in parallel to form an outer electrode for the capacitor.

18. The capacitor of claim 17, wherein the dielectric layer is a thin film between 0.5 nm and 1000 nm thick.

19. The capacitor of claim 17, wherein the dielectric layer is a sintered paste between 0.05 μm and 100 μm thick.

20. The capacitor of claim 17, wherein the dielectric material has an electrical permittivity between 10 and 10,000.

21. The capacitor of claim 17, wherein the dielectric thin film has an electrical permittivity between 2 and 100.

22. The capacitor of claim 17, wherein the dielectric thin film material is deposited by ALD.

23. The capacitor of claim 17, wherein the dielectric paste material is deposited by doctor blading.

24. The capacitor of claim 17, wherein the capacitor has a capacitance density greater than 1,000 pf/mm².

* * * * *